(12) United States Patent
Park et al.

(10) Patent No.: US 7,999,707 B2
(45) Date of Patent: Aug. 16, 2011

(54) APPARATUS FOR COMPENSATING FOR ERROR OF TIME-TO-DIGITAL CONVERTER

(75) Inventors: Mi Jeong Park, Gongju (KR); Byung Hun Min, Gunsan (KR); Ja Yol Lee, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/629,020

(22) Filed: Dec. 1, 2009

(65) Prior Publication Data

US 2010/0134335 A1 Jun. 3, 2010

(30) Foreign Application Priority Data

Dec. 2, 2008 (KR) .................. 10-2008-0121511
Oct. 23, 2009 (KR) .................. 10-2009-0101148

(51) Int. Cl.
*H03M 1/06* (2006.01)

(52) U.S. Cl. ........ 341/118; 341/119; 341/120; 341/155; 341/156

(58) Field of Classification Search .......... 341/118, 341/119, 120, 155, 166; 327/12, 3, 158, 327/107, 276; 702/189
See application file for complete search history.

(56) References Cited

U.S. PATENT DOCUMENTS

| | | | | |
|---|---|---|---|---|
| 6,374,860 B2 * | 4/2002 | Xu et al. | ........... | 137/884 |
| 6,429,693 B1 * | 8/2002 | Staszewski et al. | ........... | 327/12 |
| 6,754,613 B2 * | 6/2004 | Tabatabaei et al. | ........... | 702/189 |
| 2007/0291173 A1 | 12/2007 | Hsin | | |
| 2008/0129574 A1 * | 6/2008 | Choi et al. | ........... | 341/166 |
| 2008/0136698 A1 | 6/2008 | Choi et al. | | |
| 2008/0317188 A1 * | 12/2008 | Staszewski et al. | ........... | 375/376 |

FOREIGN PATENT DOCUMENTS

JP 2001-060864 A 3/2001

OTHER PUBLICATIONS

Robert Bogdan Staszewski et al., "1.3V 20ps Time-to-Digital Converter for Frequency Synthesis in 90-nm CMOS," IEEE T. CAS-II, Mar. 2006, pp. 220-224, vol. 53, No. 3.
V. Ramakrishnan et al., "A Wide-Range, High-Resolution, Compact, CMOS Time to Digital Converter," Proceedings of the 19th International Conference on VLSI Design, 2006, IEEE.

* cited by examiner

*Primary Examiner* — Jean B Jeanglaude

(57) ABSTRACT

An apparatus for compensating for an error of a time-to-digital converter (TDC) is disclosed to receive a delay phase from a phase detector including the TDC and a phase error including a TDC error and compensate for the TDC error to have a time resolution higher by N times (N is a natural number). The apparatus includes: a fragmenting and multiplying unit fragmenting the delay phase by N times (N is a natural number) to generate first to (N−1)th fragmented delay phases; an adding unit adding each of the first to the (N−1)th fragmented delay phases to the phase error to generate first to (N−1)th phase errors; and a comparison unit acquiring a phase error compensation value nearest to an actual phase error from the phase error and the first to (N−1)th phase errors.

13 Claims, 10 Drawing Sheets

025
APPARATUS FOR COMPENSATING FOR ERROR OF TIME-TO-DIGITAL CONVERTER

CROSS-REFERENCE TO RELATED APPLICATIONS

This application claims the priorities of Korean Patent Application No. 10-2008-0121511 filed on Dec. 2, 2008 and Korean Patent Application No. 10-2009-0101148 filed on Oct. 23, 2009, in the Korean Intellectual Property Office, the disclosures of which are incorporated herein by reference.

BACKGROUND OF THE INVENTION

1. Field of the Invention

The present invention relates to an apparatus for compensating for an error of a time-to-digital converter (TDC) capable of compensating for an error caused by a delay included in the TDC through a digital arithmetical operation scheme and simply changing the time resolution of the TDC by changing a digital control value without having to alter a device design.

2. Description of the Related Art

A time-to-digital converter (TDC) is used to measure a time difference between a reference signal and a comparison signal. Recently, the TDC is used in an all-digital phase locked loop in which a signal voltage is based on a signal period or phase, rather than a reference measurement.

FIG. 1 illustrates the related art TDC having a single delay line.

The TDC 100 includes a delay 110 including a plurality of delays 111 to 116 for delaying a first input by a delay phase ($\Phi_{\Delta t}$) to generate a plurality of delay signals, a reference line 120 for transferring a second input, flip-flops 130 for acquiring each value of the plurality of delay signals in synchronization with a rising edge or a falling edge of the second input transferred through the reference line 120, and an encoder 150 for recognizing how many delays the first input has passed through based on output values from the flip-flops 130 and providing corresponding information.

Each of the plurality of delays 111 to 116 may be implemented as an inverter, buffer, resistor, and the like, and the delay phase ($\Phi_{\Delta t}$) provided from the delays determines a time resolution value of the TDC 100. Thus, in order to accurately compare the first and second inputs, the delay phase ($\Phi_{\Delta t}$) must be fragmented to enhance time resolution of the delays.

FIG. 2 illustrates another related art TDC including Vernier delay lines.

Unlike the TDC 100 of FIG. 1, in the TDC 200 of FIG. 2, a reference line 220 includes a plurality of delays (i.e., delay chains 221 to 226) as a delay line 210 does.

In this case, delay times of a plurality of delays 211 to 216 for delaying the first input and that of the plurality of delay chains 221 to 226 for delaying the second input are different, and such differences between the delay times determines a time resolution of the TDC. For example, if the delay chains 211 to 216 included in the delay line 210 have a delay time of 20 picoseconds while the delay chains 221 to 226 included in the reference line 220 have a delay of 30 picoseconds, the TDC 200 would have a time resolution of 10 picoseconds.

The TDC 200 including the Vernier delay line as illustrated in FIG. 2 has advantageously high time resolution when compared with the TDC 100 of FIG. 1.

However, the TDC 200 has a difficulty in that the delay line 210 to which the first input is transferred and the reference line 220 to which the second input is transferred must be accurately synchronized.

In addition, compared with the TDC 100 of FIG. 1, because the TDC 200 in FIG. 2 performs a time-to-digital conversion operation with the small time resolution, it takes time to measure the interval between the signal of the first input and that of the second input, the hardware size increases, and much power is consumed.

SUMMARY OF THE INVENTION

An aspect of the present invention provides an apparatus for compensating for an error of a time-to-digital converter (TDC) capable of improving a time resolution of a TDC by compensating for an error of the TDC through a digital arithmetic operation scheme, rather than using an analogwise circuit designing method that disadvantageously shortens a delay phase ($\Phi_{\Delta t}$).

Another aspect of the present invention provides an apparatus for compensating for an error of a time-to-digital converter (TDC) capable of varying a time resolution of a TDC by changing a digital control value without having to alter the design of the TDC.

According to an aspect of the present invention, there is provided an apparatus for compensating for an error of a TDC, which receives a delay phase and a TDC error-contained phase error from a phase detector including the TDC, including: a fragmenting and multiplying unit fragmenting the delay phase by N times (N is a natural number) to generate first to (N−1)th fragmented delay phases; an adding unit adding each of the first to the (N−1)th fragmented delay phases to the phase error to generate first to (N−1)th phase errors; and a comparison unit acquiring a phase error compensation value nearest to an actual phase error from the phase error and the first to (N−1)th phase errors.

According to another aspect of the present invention, there is provided an apparatus for compensating for an error of a TDC, which receives a delay phase and a TDC error-contained phase error from a phase detector including the TDC, including: first to Mth multipliers fragmenting the delay phase by ½ to ½$^M$ times; first to (2M−1)th adder adding the phase error to an output from the first multiplier, and adding and subtracting an output of an upper comparator to and from each of outputs from the second to Mth multipliers; and first to Mth comparators comparing the phase error and an output from the first adder and comparing the output from the upper comparator and outputs from mutually adjacent adders among the second to the (2M−1)th adders to acquire a phase error compensation value nearest to an actual phase error.

According to another aspect of the present invention, there is provided an apparatus for compensating for an error of a TDC, which receives a delay phase and a TDC error-contained phase error from a phase detector including the TDC, including: a primary comparison unit adding a delay phase, which has been fragmented by ½ times, to the phase error, and comparing the resultant value with the phase error; a multiplexer receiving an output from the primary comparison unit and a phase error correction value, selectively outputting an output from the primary comparison unit when a control signal has a first value, and selectively outputting the phase error correction value when the control signal has a second value; and a secondary comparison unit adding or subtracting a delay phase, which has been fragmented by ½M (M is a natural number of 2 or larger), to and from an output from the multiplexer, and comparing the resultant value with the output from the multiplexer to acquire a phase error compensation value nearest to an actual phase error.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
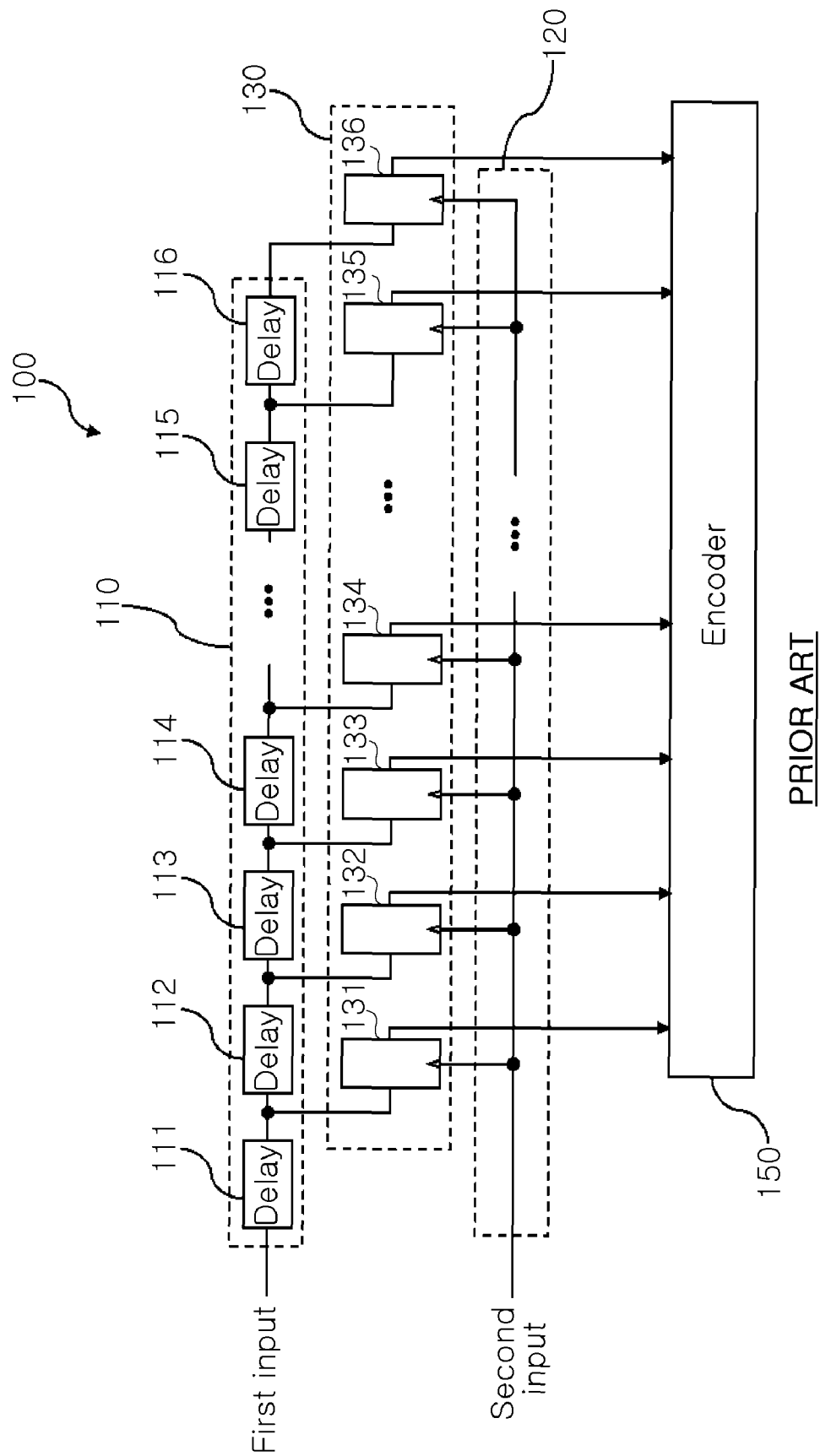
FIG. 1 is a schematic block diagram of the related art time-to-digital converter (TDC) including a single delay line.
Figure 2:
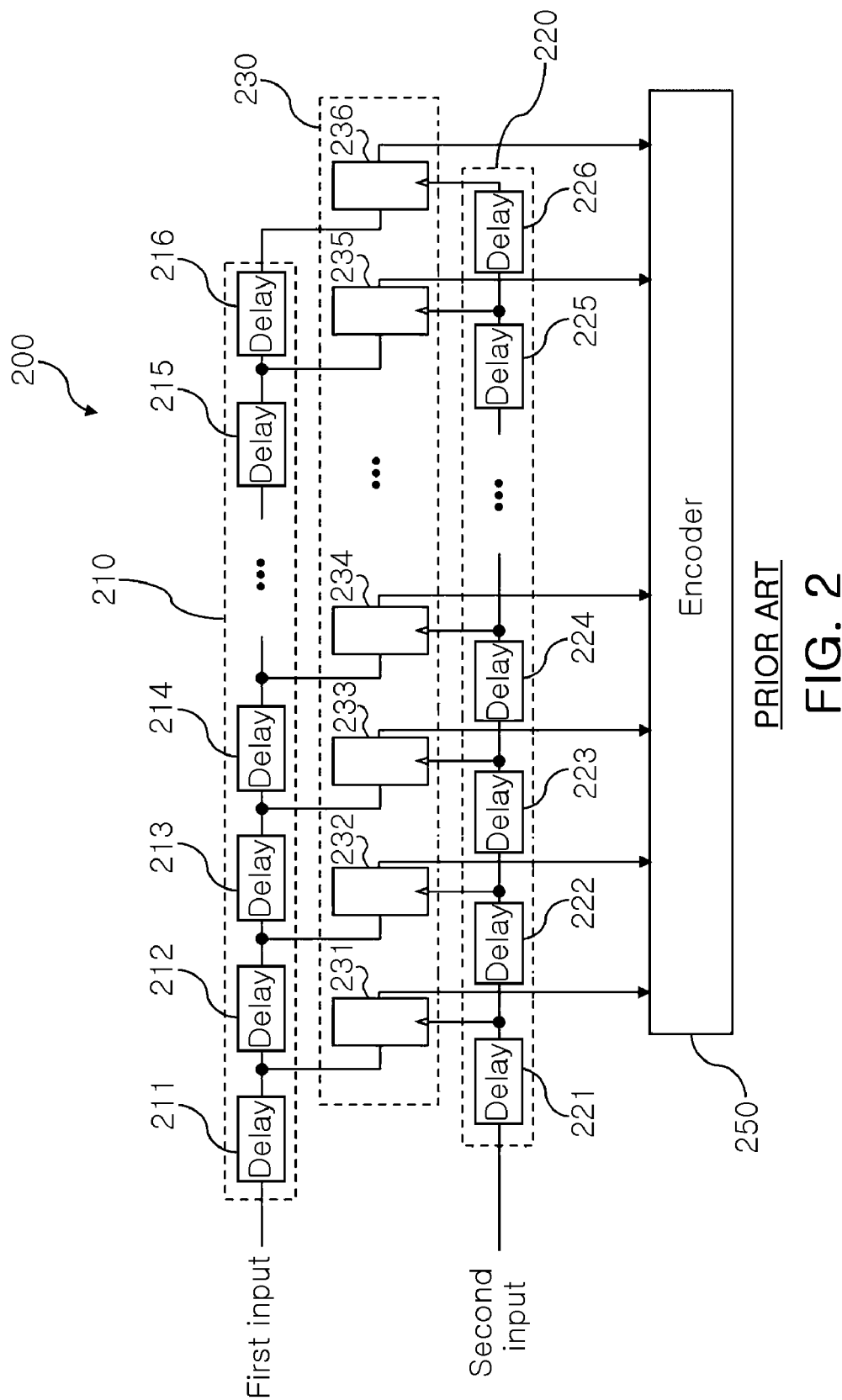
FIG. 2 is a schematic block diagram of the related art time-to-digital converter (TDC) including a Vernier delay line.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

It will be understood that when an element is referred to as being "connected with" another element, it can be directly connected with the other element or intervening elements may also be present. In contrast, when an element is referred to as being "directly connected with" another element, there are no intervening elements present. In addition, unless explicitly described to the contrary, the word "comprise" and variations such as "comprises" or "comprising," will be understood to imply the inclusion of stated elements but not the exclusion of any other elements.

Figure 3:
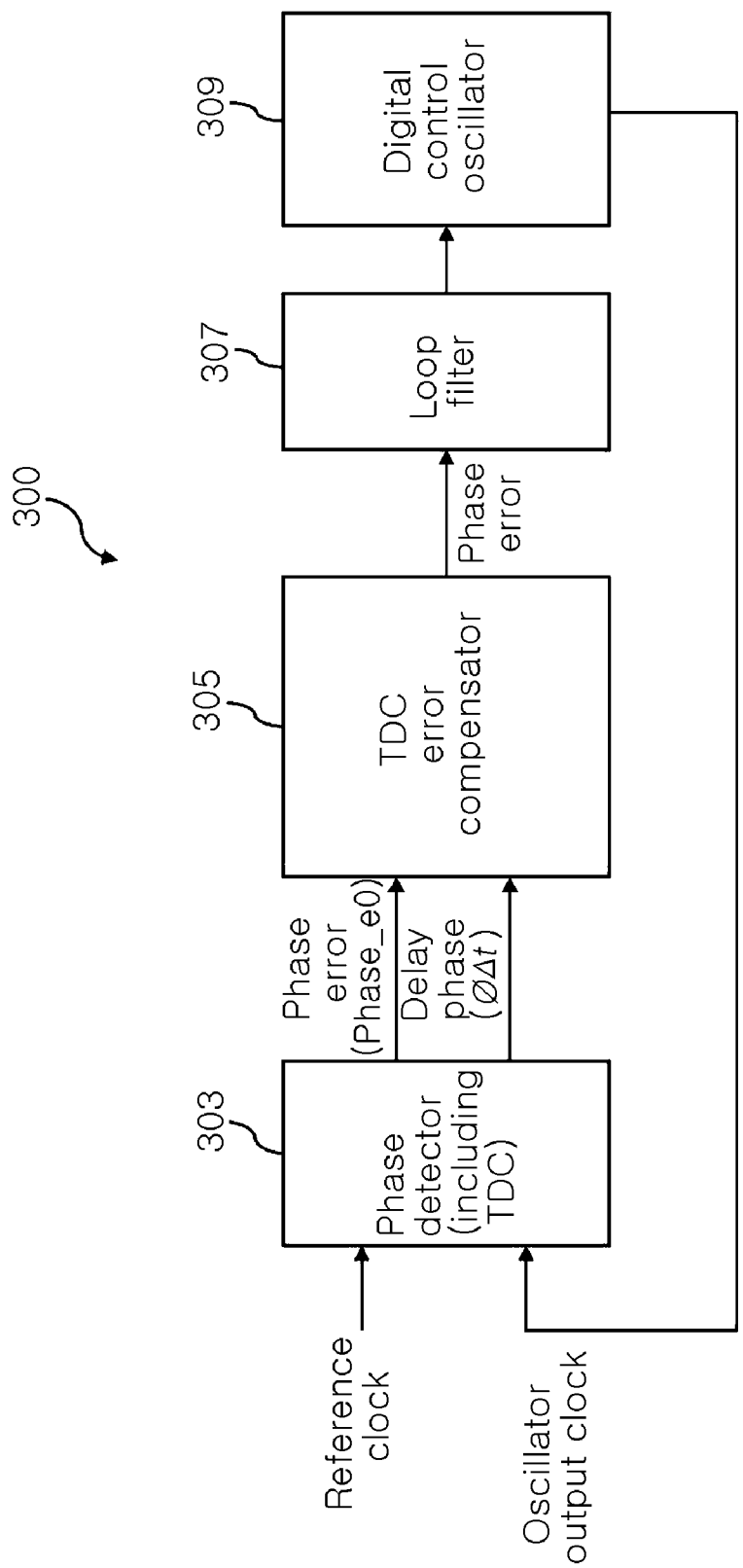
FIG. 3 is a schematic block diagram of an all-digital phase locked loop (ADPLL) according to a first exemplary embodiment of the present invention.

FIG. 3 is a schematic block diagram of an all-digital phase locked loop (ADPLL) according to a first exemplary embodiment of the present invention.

With reference to FIG. 3, an ADPLL according to the first exemplary embodiment of the present invention includes: a phase detector 303, a loop filter 307, a digital control oscillator 309, and a time-to-digital converter (TDC) error compensator 305 positioned between the phase detector 303 and the loop filter 307.

The phase detector 303, including a TDC, detects a phase error (Phase_e0) between a reference clock and an oscillator output clock, and outputs the detected phase error (Phase_e0) along with a delay phase ($\Phi_{\Delta t}$) of the TDC. In this case, the phase error (Phase_e0) obtained by using the TDC includes a TDC error larger than or the same as 0 and smaller than the delay phase ($\Phi_{\Delta t}$).

The TDC error compensator 305 fragments the delay phase ($\Phi_{\Delta t}$) by N times (N is a natural number) and adds the fragmented delay phases to the phase error (Phase_e0) to generate new phase errors (Phase_e1 to Phase_e(N−1)), acquires a phase error having a value nearest to an actual phase error (i.e., a phase error compensation value), and outputs the acquired phase error. Namely, the TDC error compensator 305 outputs the TDC error by 1/N times and outputs the same.

In this case, when the loop filter 307 is implemented as an integrator, the actual phase error (i.e., a phase error when the ADPLL is locked) is acquired on the assumption that an input signal of the loop filter 307 is 0, or otherwise, the actual phase error may be acquired by calculating an average value of phase errors (Phase_e0) generated during a certain time period.

The loop filter 307 multiplies a gain value determining a bandwidth of the ADPLL to the phase error compensation value output from the TDC error compensator 305 to generate an input of the digital control oscillator 309.

The digital control oscillator 309 oscillates a frequency corresponding to the digital input provided from the loop filter 307.

In order to compensate for the TDC error, the TDC error compensator 305 uses the phase error (Phase_e0) including the TDC error, as a reference.

The delay phase ($\Phi_{\Delta t}$) is a value obtained by changing a time delay value corresponding to a single delay used in the TDC of the phase detector into a phase value, so $\Phi_{\Delta t} \times (1/N)$ means that the phase delay ($\Phi_{\Delta t}$) has been fragmented by N times.

Actually, it is not known how many times TDC errors occur, and it is only known that the TDC error range satisfies Equation 1 shown below:

$$0 \leq \text{TDC error} \leq (\Phi_{\Delta t}) \qquad \text{[Equation 1]}$$

Thus, after the delay phase ($\Phi_{\Delta t}$) is fragmented by N times (N is a natural number), the fragmented delay phases are added to the phase error (Phase_e0), respectively, and then, the phase error having the value nearest to the actual phase error is selected to obtain the effect that the phase error has been reduced by 1/N.

Figure 4A:
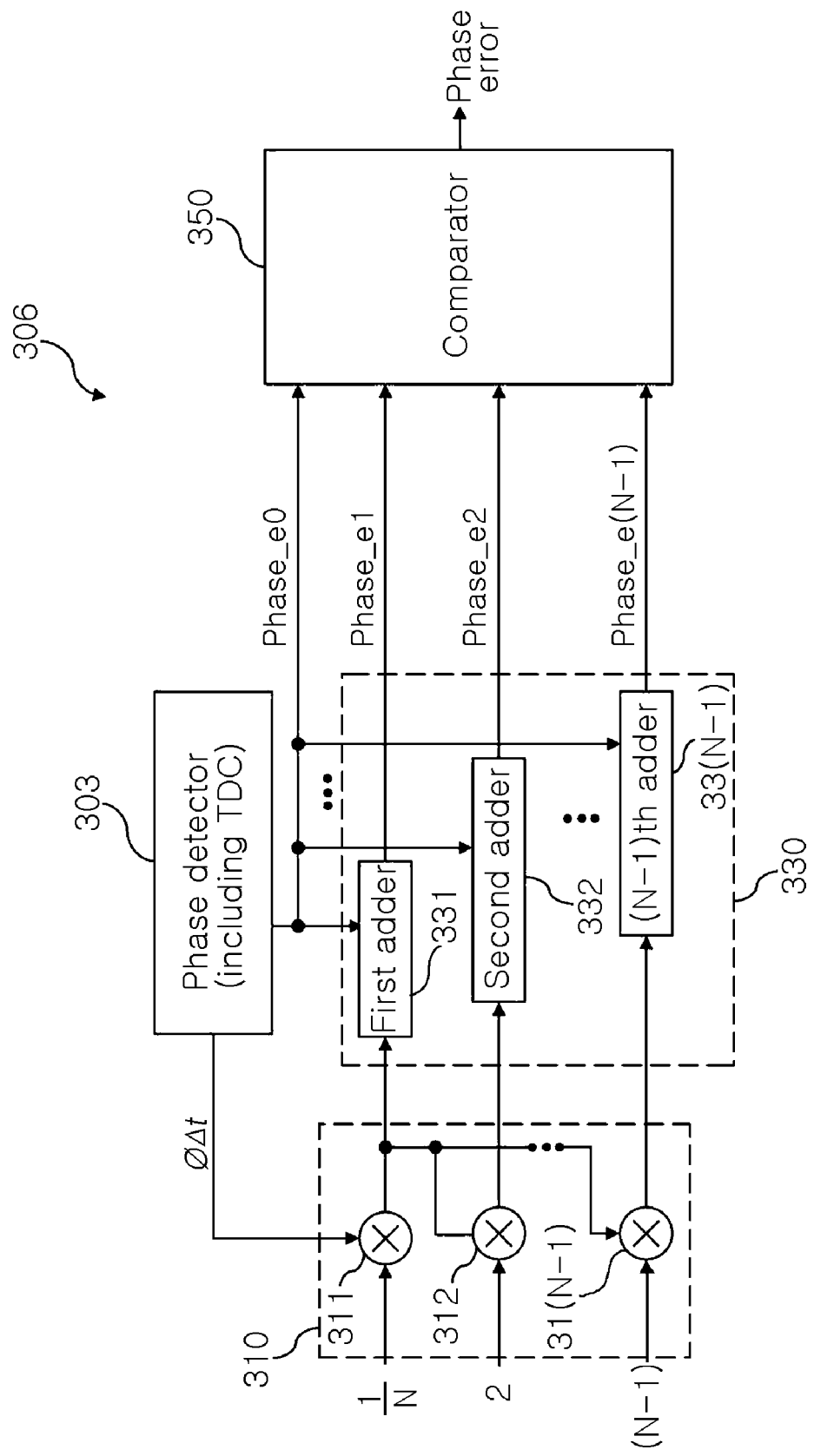
FIG. 4a is a schematic block diagram of a TDC error compensator according to the first exemplary embodiment of the present invention.

FIG. 4a is a schematic block diagram of a TDC error compensator according to the first exemplary embodiment of the present invention, in which a TDC encoder performs a descending arithmetic operation.

With reference to FIG. 4a, the TDC error compensator according to the first exemplary embodiment of the present invention includes a fragmenting and multiplying unit 310, an adding unit 330, and a comparison unit 350.

The fragmenting and multiplying unit 310 fragments the delay phase ($\Phi_{\Delta t}$) by N times according to the time resolution (N) of the TDC error compensator. To this end, the fragmenting and multiplying unit 310 includes a plurality of multipliers 311 to 31 (N−1) that multiply the values of 1 to (N−1)/N to the delay phase ($\Phi_{\Delta t}$) to generate first to (N−1)th fragmented delay phases, respectively.

The adding unit 330 additionally generates a plurality of phase errors having the fragmented delay phases. To this end, the adding unit 330 includes a plurality of adders 331 to 33 (N−1) that add the first to (N−1)th fragmented delay phases ($\Phi_{\Delta t} \times 1/N$ to $\Phi_{\Delta t} \times (N-1)/N$) to the phase error (Phase_e0), respectively, to generate first to (N−1)th phase errors (Phase_e1 to Phase_e(N−1)), respectively, thus generating the plurality of phase errors having the fragmented delay phases.

For example, when the TDC error compensator has a time resolution of N=8, the adding unit 330 generates first to seventh phase errors (Phase_e1 to Phase_e7) according to Equation 2 shown below:

$$Phase\_e1 = Phase\_e0 + \Phi_{\Delta t} \times 1/8$$

$$Phase\_e2 = Phase\_e0 + \Phi_{\Delta t} \times 2/8$$

$$Phase\_e3 = Phase\_e0 + \Phi_{\Delta t} \times 3/8$$

$$Phase\_e4 = Phase\_e0 + \Phi_{\Delta t} \times 4/8$$

$$Phase\_e5 = Phase\_e0 + \Phi_{\Delta t} \times 5/8$$

$$Phase\_e6 = Phase\_e0 + \Phi_{\Delta t} \times 6/8$$

$$Phase\_e7 = Phase\_e0 + \Phi_{\Delta t} \times 7/8 \qquad [\text{Equation 2}]$$

The comparison unit 350 compares the phase error (Phase_e0) and the first to (N−1)th phase errors (Phase_e1 to Phase_e(N−1)), selectively acquires a phase error having a value nearest to the actual phase error from among the first to (N−1)th phase errors (Phase_e1 to Phase_e(N−1)) as a phase compensation value, and outputs the acquired phase compensation value.

Figure 4B:
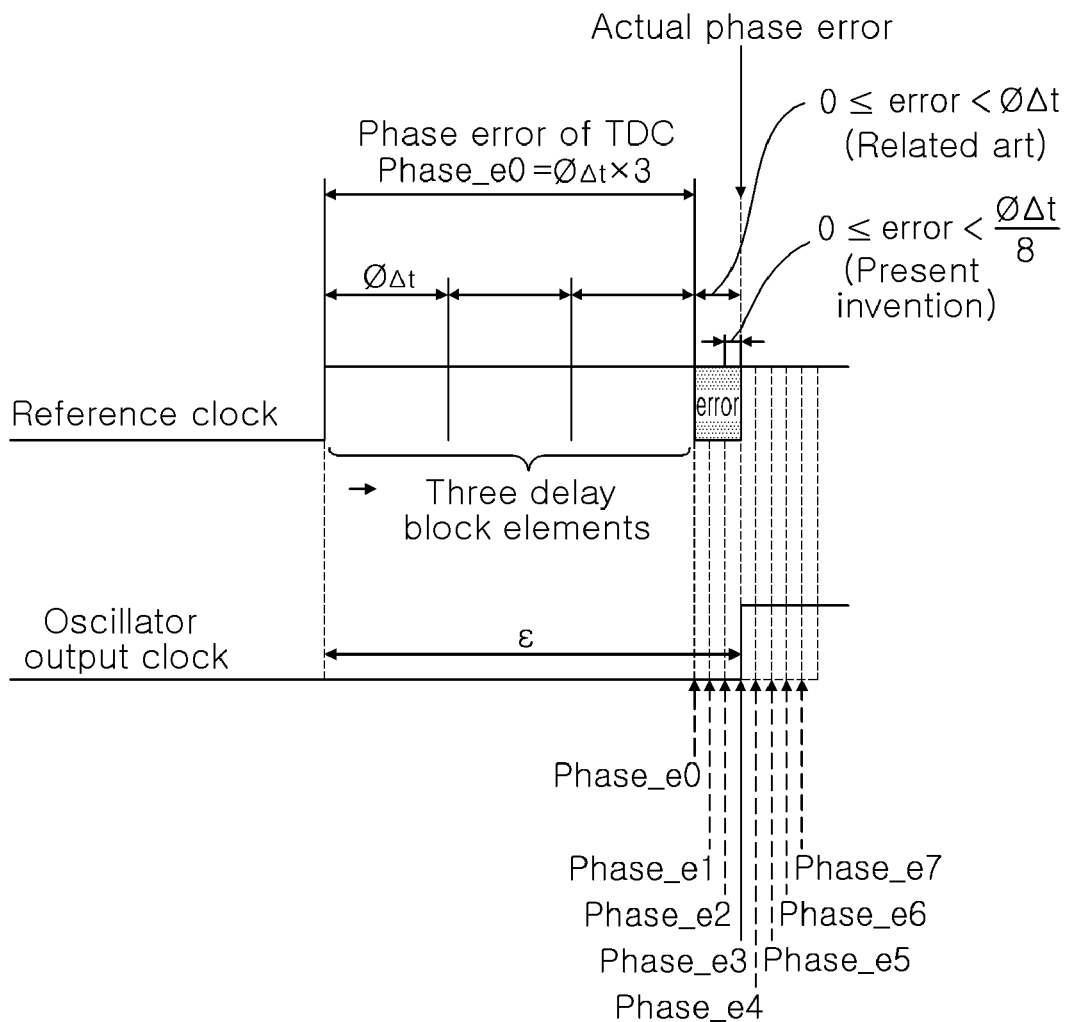
FIG. 4b is a view for explaining a method for compensating for an error of a TDC according to the first exemplary embodiment of the present invention.

FIG. 4b is a view for explaining a method for compensating for an error of a TDC according to the first exemplary embodiment of the present invention, in which the TDC encoder performs a descending arithmetic operation. In the following description, it is assumed that the time resolution of the TDC error compensator is "N=8" for the sake of brevity.

Basically, the TDC of the phase detector 303 serves to obtain a phase error between a reference clock and an oscillator output clock and compensate for it. However, in the related art, only phase errors by integer times (i.e., integral multiple) of the delay phase ($\Phi_{\Delta t}$) can be acquired for compensation due to the delay phase ($\Phi_{\Delta t}$) of the delays provided in the TDC.

If the reference clock and the oscillator output clock have a phase error ($\epsilon$) ranging from $3 \times \Phi_{\Delta t}$ to $4 \times \Phi_{\Delta t}$, the TDC would acquire only information that a total of three delays have been passed, obtaining $3 \times \Phi_{\Delta t}$ as the phase error (Phase_e0).

As a result, an error as much as $0 \leq error < \Phi_{\Delta t}$ is generated between the actual phase error ($\epsilon$) and the phase error (Phase_e0) obtained by using the TDC.

Thus, in the present exemplary embodiment, the delay phase ($\Phi_{\Delta t}$) is fragmented by N times and then added to the phase error (Phase_e0) to generate new phase errors (Phase_e1 to Phase_e(N−1)). From among the newly generated phase errors (Phase_e1 to Phase_e(N−1)), a phase error having a value nearest to the actual phase error is selectively acquired and outputted. Thus, an error merely as much as "$0 \leq error < \Phi_{\Delta t}/N$" is generated between the actual phase error ($\epsilon$) and the phase error compensation value. Namely, the TDC error is reduced by the N times.

Figure 5A:
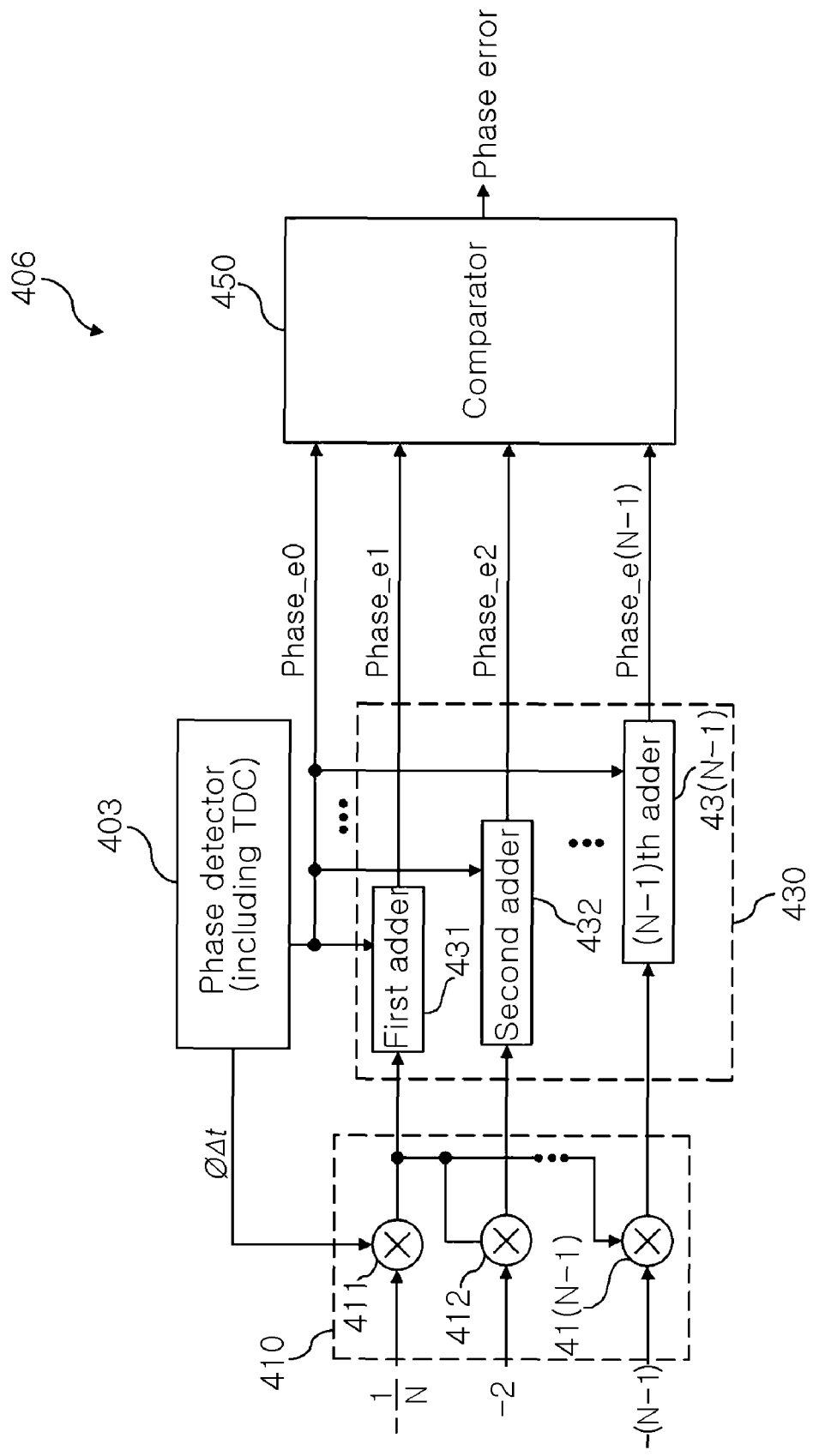
FIG. 5a is a schematic block diagram of a TDC error compensator according to a second exemplary embodiment of the present invention.

FIG. 5a is a schematic block diagram of a TDC error compensator according to a second exemplary embodiment of the present invention, in which the TDC encoder performs an ascending arithmetic operation.

With reference to FIG. 5a, the TDC error compensator according to the second exemplary embodiment of the present invention includes a fragmenting and multiplying unit 410, an adding unit 430, and a comparison unit 450.

The fragmenting and multiplying unit 410 fragments the delay phase ($\Phi_{\Delta t}$) by N times according to the time resolution (N) of the TDC error compensator. To this end, the fragmenting and multiplying unit 410 includes a plurality of multipliers 411 to 41(N−1) that multiply the values of 1 to (N−1)/N to the delay phase ($\Phi_{\Delta t}$) to generate first to (N−1)th fragmented delay phases, respectively.

The adding unit 430 additionally generates a plurality of phase errors having the fragmented delay phases. To this end, the adding unit 430 includes a plurality of adders 431 to 43(N−1) that add the first to (N−1)th fragmented delay phases ($\Phi_{\Delta t} \times 1/N$ to $\Phi_{\Delta t} \times (N-1)/N$) to the phase error (Phase_e0), respectively, to generate first to (N−1)th phase errors (Phase_e1 to Phase_e(N−1)), respectively, thus generating the plurality of phase errors having the fragmented delay phases.

For example, when the TDC error compensator has a time resolution of N=8, the adding unit 430 generates first to seventh phase errors (Phase_e1 to Phase_e7) according to Equation 3 shown below:

$$Phase\_e1 = Phase\_e0 - \Phi_{\Delta t} \times 1/8$$

$$Phase\_e2 = Phase\_e0 - \Phi_{\Delta t} \times 2/8$$

$$Phase\_e3 = Phase\_e0 - \Phi_{\Delta t} \times 3/8$$

$$Phase\_e4 = Phase\_e0 - \Phi_{\Delta t} \times 4/8$$

$$Phase\_e5 = Phase\_e0 - \Phi_{\Delta t} \times 5/8$$

$$Phase\_e6 = Phase\_e0 - \Phi_{\Delta t} \times 6/8$$

$$Phase\_e7 = Phase\_e0 - \Phi_{\Delta t} \times 7/8 \qquad [\text{Equation 3}]$$

The comparison unit 450 compares the phase error (Phase_e0) with the first to (N−1)th phase errors (Phase_e1 to Phase_e(N−1)), selectively acquires a phase error having a value nearest to the actual phase error from among the first to (N−1)th phase errors (Phase_e1 to Phase_e(N−1)), as a phase compensation value, and outputs the acquired phase compensation value.

Figure 5B:
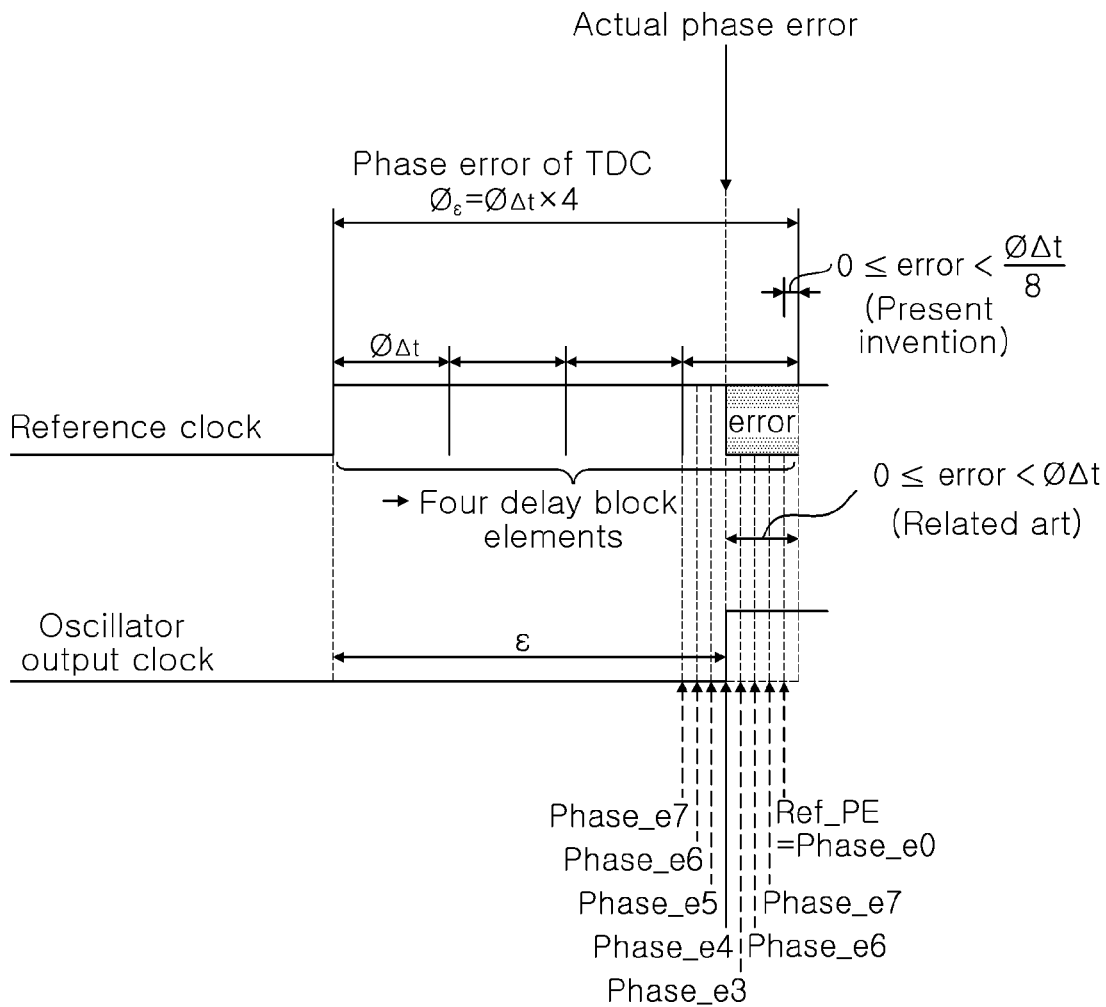
FIG. 5b is a view for explaining a method for compensating for an error of a TDC according to the second exemplary embodiment of the present invention.

FIG. 5b is a view for explaining a method for compensating for an error of a TDC according to the second exemplary embodiment of the present invention, in which the TDC encoder performs an ascending arithmetic operation. In the following description, it is assumed that the time resolution of the TDC error compensator is "N=8" for the sake of brevity.

When the TDC encoder performs an ascending arithmetic operation, if the reference clock and the oscillator output clock have the phase error ($\epsilon$) ranging from $3 \times \Phi_{\Delta t}$ to $4 \times \Phi_{\Delta t}$, the TDC would acquire information that a total of four delays have been passed, obtaining $4 \times \Phi_{\Delta t}$ as the phase error (Phase_e0).

As a result, an error as much as $0 \leq error < \Phi_{\Delta t}$ is generated between the actual phase error ($\epsilon$) and the phase error (Phase_e0) obtained by using the TDC.

Thus, in the present exemplary embodiment, the delay phase ($\Phi_{\Delta t}$) is fragmented by N times and then added to the phase error (Phase_e0) to generate new phase errors (Phase_e1 to Phase_e(N−1)). From among the newly generated phase errors (Phase_e1 to Phase_e(N−1)), a phase error having a value nearest to the actual phase error is selectively acquired and outputted. Thus, an error merely as small as "$0 \leq error < \Phi_{\Delta t}/8$" is generated between the actual phase error ($\epsilon$) and the phase error compensation value. Namely, the TDC error is reduced by N times.

Figure 6:
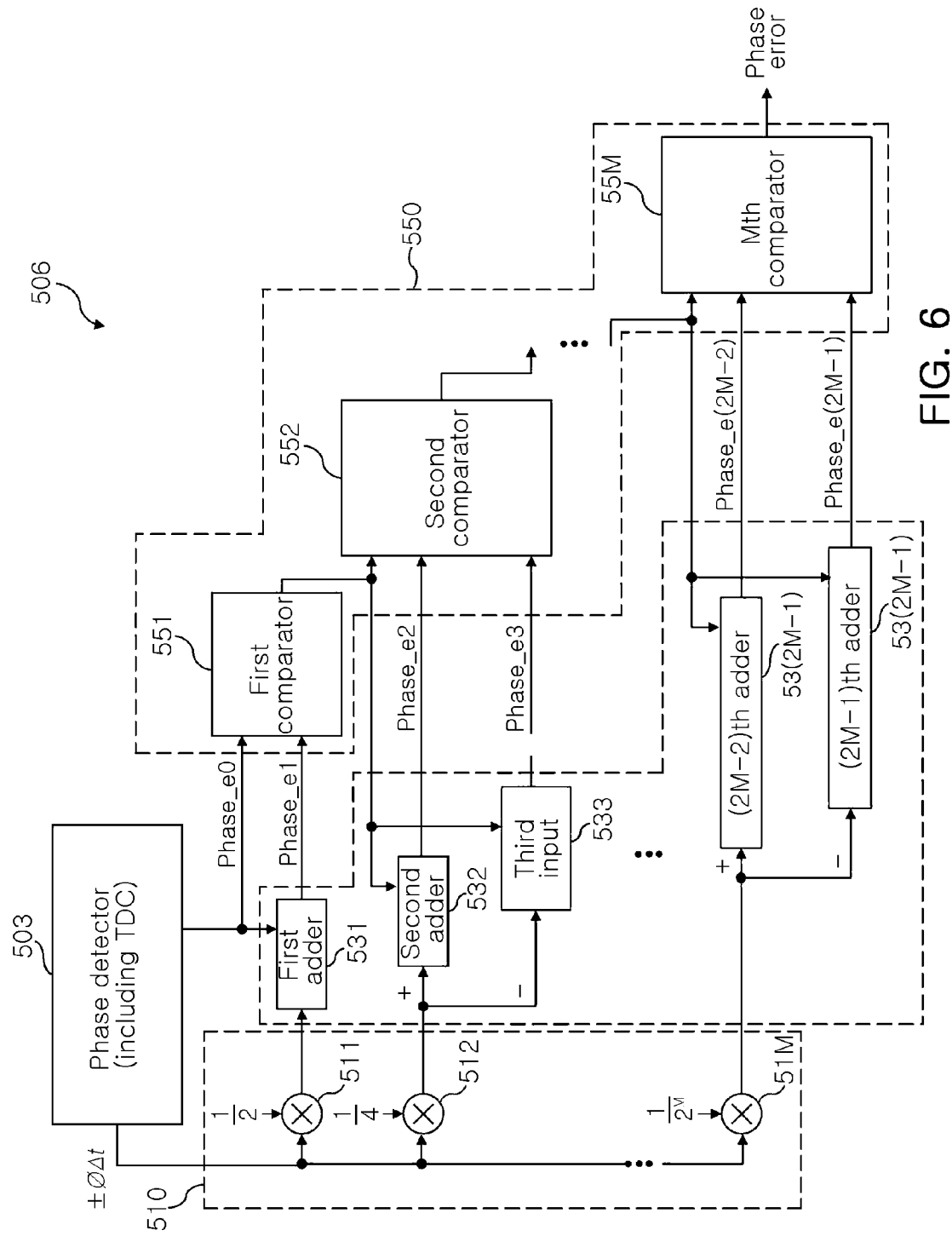
FIG. 6 is a schematic block diagram of a TDC error compensator according to a third exemplary embodiment of the present invention.
Figure 7:
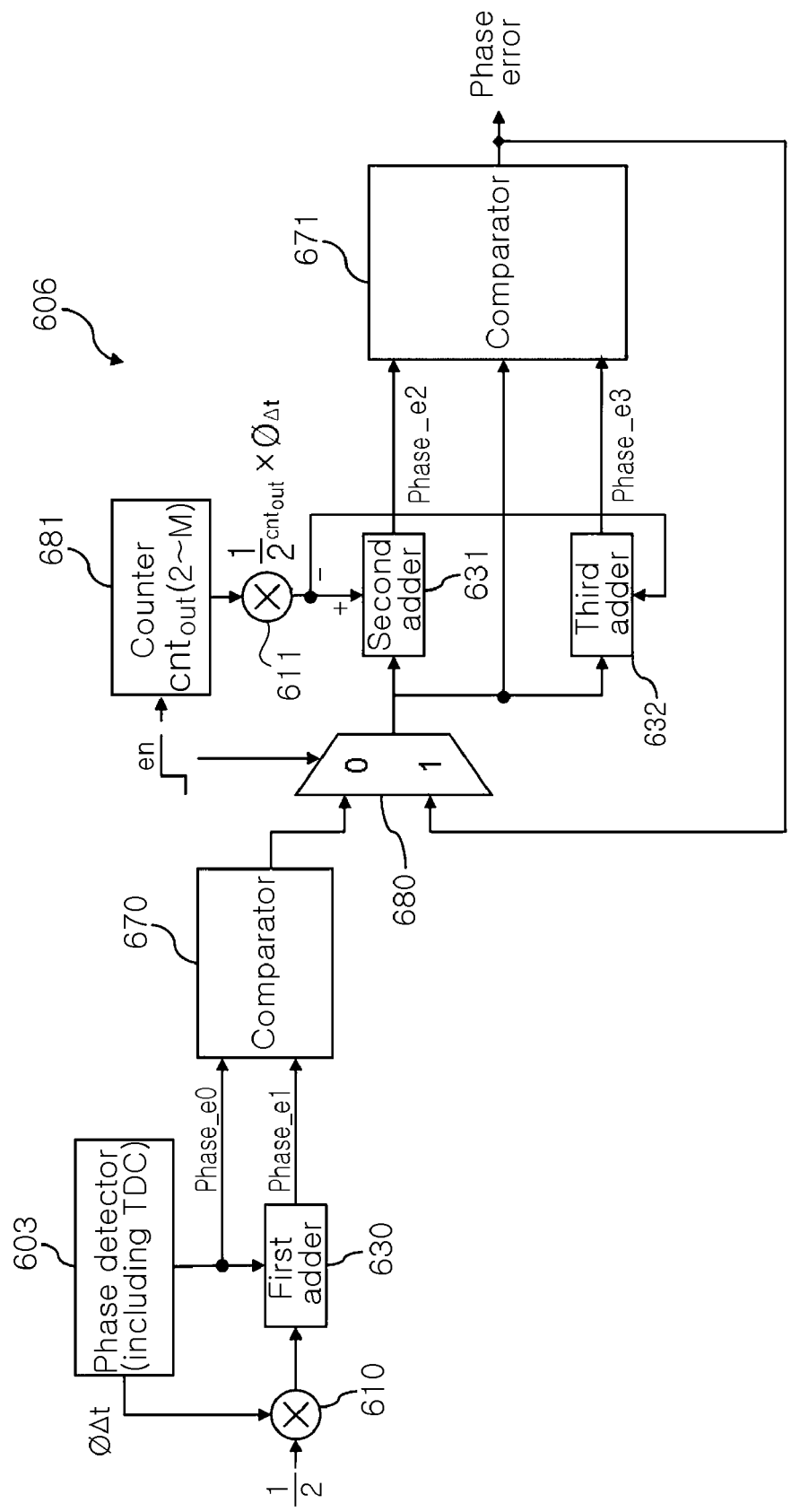
FIG. 7 is a schematic block diagram of a TDC error compensator according to a fourth exemplary embodiment of the present invention.

In addition, as shown in FIGS. 6 and 7, the present invention proposes a TDC error compensator including a smaller number of adders compared with time resolution of the TDC error compensator.

FIG. 6 is a schematic block diagram of a TDC error compensator according to a third exemplary embodiment of the present invention.

With reference to FIG. 6, the TDC error compensator according to the third exemplary embodiment of the present invention includes first to Mth multipliers 511 to 51M, first to (2M−1)th adders 531 to 53 (2M−1), and first to Mth comparators 551 to 55M.

In this case, if the TCD within a phase detector 503 employs the descending arithmetic operation, it requires the delay phase ($\Phi_{\Delta t}$) as an input, and if the TDC within the phase detector 503 employs the ascending arithmetic operation, it requires a value obtained by −1 to the delay phase ($\Phi_{\Delta t}$), as an input. In FIG. 6, it is shown that the phase detector 503 performs outputting differently according to the arithmetic operation schemes of the phase detector 503, but multiplying of −1 to the phase delay ($\Phi_{\Delta t}$) may be performed at a later stage.

With reference to FIG. 6, the first to Mth multipliers 511 to 51M fragment the delay phase ($\Phi_{\Delta t}$) of the phase detector 503 by ½ to $½^M$ to generate ½ to $½^M$ fragmented delay phases ($\Phi_{\Delta t} \times ½$ to $\Phi_{\Delta t} \times ½^M$).

The first adder 531 adds the phase error (Phase_e0) to the (½)th fragmented delay phase ($\Phi_{\Delta t} \times ½$) to generate a first phase error (Phase_e1).

The second to (2M−1)th adders 532 to 53 (2M−1) add or subtract outputs, which are from the upper comparators (namely, which are from the first to (M−1)th comparators corresponding to each of (½)th to $(½^{(M-1)})$th fragmented delay phases ($\Phi_{\Delta t} \times ½ \sim \Phi_{\Delta t} \times ½^M$)), to or from the (¼)th to $(½^M)$th fragmented delay phases ($\Phi_{\Delta t} \times ¼ \sim \Phi_{\Delta t} \times ½^M$) to generate second to (2M−1)th phase errors (Phase_e2 to Phase_e (2M−1).

In detail, among the second to (2M−1)th adders 532 to 53 (2M−1), the mutually adjacent adders (e.g., 532 and 533) add or subtract the same output from the comparator 551 to or from the output from the same multiplier 512, and in this case, among the mutually adjacent adders 532 and 533, the adder 532 positioned in an even row adds the output from the comparator 551 to the output from the multiplier 512, and the adder 533 positioned in an odd row subtracts the output from the comparator 551, from the output from the multiplier 512.

The first comparator 551 compares the phase error (Phase_e0) with the first phase error (Phase_e1), acquires a phase error having a value nearest to the actual phase error, and outputs the acquired phase error.

The second to Mth comparators 552 to 55M perform the operations of comparing the outputs from the upper comparators 551 to 55(M−1) with outputs from the mutually adjacent adders among the second to (2M−1)th adders 531 to 53 (2M−1), acquiring the phase error having a value nearest to the actual phase error, and outputting the acquired phase error, to thus generate the first to Mth comparison values and finally output the Mth comparison value as the phase compensation value.

A method for compensating for an error of a TDC according to the third exemplary embodiment of the present invention will now be described with reference to FIG. 6.

First, the delay phase ($\Phi_{\Delta t}$) provided from the phase detector 530 is fragmented by ½ to $½^M$ times to generate the (½)th to $(½^M)$th fragmented delay phases ($\Phi_{\Delta t} \times ½$ to $\Phi_{\Delta t} \times ½^M$).

The phase error (Phase_e0) is added to the (½)th fragmented delay phase ($\Phi_{\Delta t} \times ½$) and they are then compared to acquire a phase error having a value nearest to the actual phase error as a phase error compensation value, and the acquired phase error is output.

The delay phase fragmented by ¼ times is added to and subtracted from the phase error compensation value; the obtained values are compared with the phase error compensation value so as to update the phase error compensation value.

This operation is repeatedly performed on each of the delay phases which have been fragmented by $½^X (2 \leqq X \leqq M)$ times. When all the comparators complete the above-described operation (namely, when the X value is greater than M), the phase error compensation value finally updated is acquired and output.

The TDC error compensators illustrated in FIGS. 4a and 5a need the (N−1) number of adders, while the TDC error compensator illustrated in FIG. 6 needs only the (2M−1) number of adders, so as the value of N increases, the TDC error compensator illustrated in FIG. 6 will need an even smaller number of adders.

FIG. 7 is a schematic block diagram of a TDC error compensator according to a fourth exemplary embodiment of the present invention.

The TDC error compensator illustrated in FIG. 7 includes first and second multipliers 610 and 611, first to third adders 630 to 632, first and second comparators 670 and 671, a multiplexer 680, and a counter 681. The TDC error compensator of FIG. 7 uses the same principle as that of the TDC error compensator illustrated FIG. 5a. However, in an implementation method, the TDC error compensator illustrated in FIG. 7 has a simpler hardware size by forming the counter 681 and the multiplexer 680 generating values of 2 to M.

The first multiplier 610 multiplies ½ to the delay phase ($\Phi_{\Delta t}$) to generate ½ fragmented delay phase ($\Phi_{\Delta t} \times ½$). The first adder 630 adds the phase error (Phase_e0) to the ½ fragmented delay phase ($\Phi_{\Delta t} \times 1;2$) to generate a first phase error (Phase_e1). The first comparator 670 compares the phase error (Phase_e0) with the first phase error (Phase_e1) to acquire a phase error having a value nearest to the actual phase error, and outputs the acquired phase error.

The multiplexer 680 receives an output and the phase compensation value (i.e., the phase error) from the first comparator 670. When a control signal (en) is 0, the multiplexer 680 selectively outputs the output from the first comparator 670, whereas when the control signal (en) is 1, the multiplexer 680 outputs the phase error compensation value (phase error).

The second multiplier 611 multiples to the delay phase ($\Phi_{\Delta t}$) according to an output value ($cnt_{out}$) of the counter 681.

The second and third adders 631 and 632 add and subtract an output from the second multiplier to and from the output from the multiplexer 680 to generate second and third phase errors (Phase_e2 and Phase_e3).

The second comparator 671 compares the output from the multiplexer 680 with the second and third phase errors (Phase_e2 and Phase_e3) to acquire a phase error having a value nearest to the actual phase error, and outputs the acquired phase error as a phase error compensation value.

The counter 681 sequentially outputs 2 to M (M is a natural number) required for the multiplying operation of the second multiplier 611.

A method for correcting a TDC error according to the fourth exemplary embodiment of the present invention will now be described with reference to FIG. 7.

First, the delay phase ($\Phi_{\Delta t}$) provided from the phase detector 530 is fragmented by ½ to $½^M$ times to generate the (½)th to $(½^M)$th fragmented delay phases ($\Phi_{\Delta t} \times ½$ to $\Phi_{\Delta t} \times ½^M$).

The delay phase ($\Phi_{\Delta t} \times ½$) which has been fragmented by ½ times is added to the phase error (Phase_e0) provided from the phase detector 503 to generate the first phase error (Phase_e1). The first phase error (Phase_e1) is then compared with the phase error (Phase_e0) to output a comparison result value.

The multiplexer 680 receives the comparison result value and the phase error compensation value (i.e., the phase error), and when the control signal (en) is 0, the multiplexer 680 selectively outputs the comparison result value, whereas when the control signal (en) is 1, the multiplexer 680 outputs the phase error compensation value (phase error).

The delay phase which has been fragmented by the ½M (M is a natural number of 2 or larger) is added to or subtracted from the output from the multiplexer 680 to generate the second and third phases (Phase_e2 and Phase_e3). The second and third phases (Phase_e2 and Phase_e3) are then compared with the output from the multiplexer 680 to finally acquire a phase error compensation value (phase error) having a value nearest to the actual phase error so as to be output.

Figure 8:
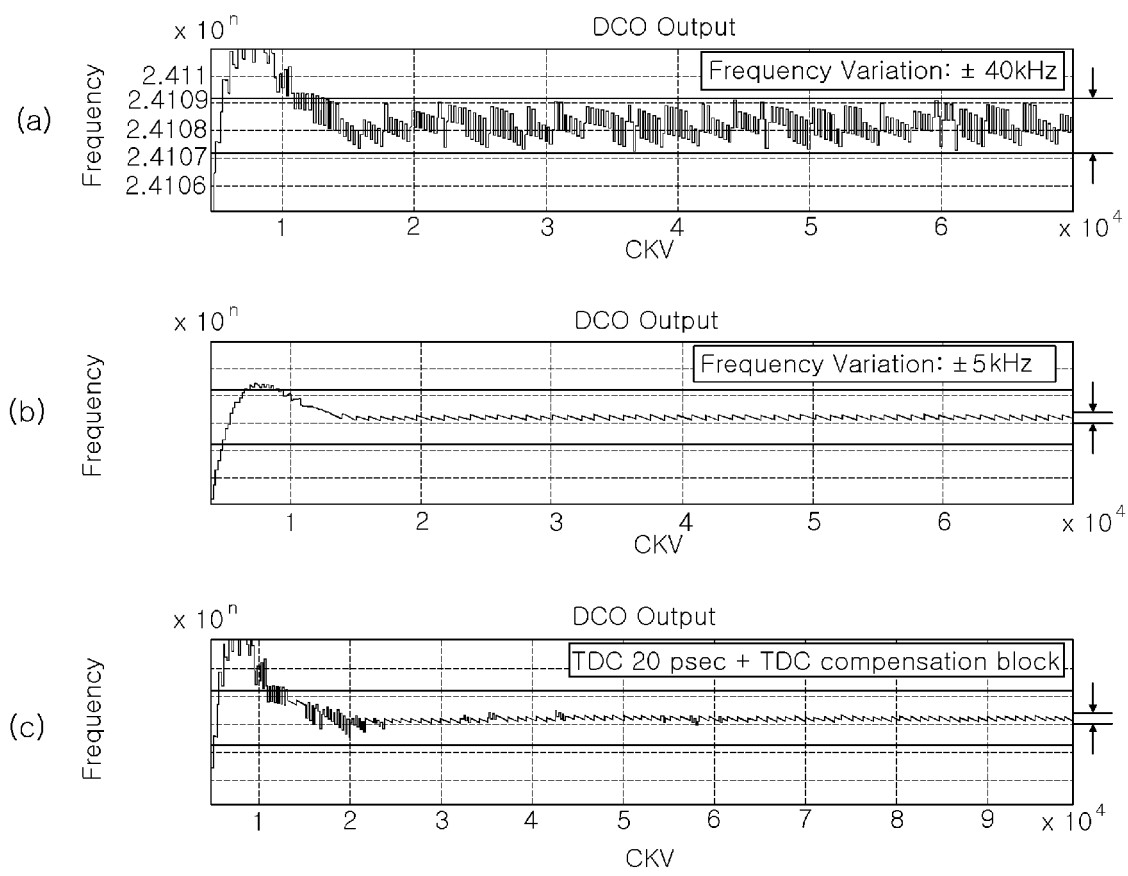
FIG. 8 is graphs of simulation results showing variations in output frequencies over time by applying the TDC error compensator to the ADPLL.

FIG. 8 is graphs of simulation results showing variations in output frequencies over time by applying the TDC error compensator to the ADPLL.

Graph (a) shows a frequency variation of ADPLL using a TDC having a single delay line with delays of 20 picoseconds. After an ADPLL output frequency was locked due to an error because of the TDC delays, a frequency variation of about ±40 KHz was observed.

Graph (b) shows a frequency variation of ADPLL using a TDC having a single delay line with delays of 2.5 picoseconds. After an ADPLL output frequency was locked, a frequency variation of about ±5 KHz was observed. A delay time of the TDC delays was 20 picoseconds/8=2.5 picoseconds, so it is noted that the frequency variation was reduced to about ⅛.

Graph (c) shows the simulation results obtained by adding a TDC error compensator to the ADPLL solely having the results of (a). Because only a value within $\Phi_{\Delta t}$ is available for the phase compensation, a frequency variation was not within the range of ±5 kHz at some portions, like the circled portions, where an error is greater than $\Phi_{\Delta t}$, but it is noted that the frequency variation was gradually stabilized to come within the range of ±5 kHz.

As set forth above, the apparatus for compensating for an error of the TDC according to exemplary embodiments of the invention can compensate for an error of the TDC merely through a simple hardware configuration by using a digital arithmetic operation technique, not using an analogwise circuit designing method that shortens a time delay of a delay. In addition, the user can select a time resolution of the TDC, and simply select a time resolution of the TDC by changing a digital control value without having to alter the device design.

While the present invention has been shown and described in connection with the exemplary embodiments, it will be apparent to those skilled in the art that modifications and variations can be made without departing from the spirit and scope of the invention as defined by the appended claims.

What is claimed is:

1. An apparatus for compensating for an error of a TDC, which receives a delay phase and a TDC error-contained phase error from a phase detector including the TDC, the apparatus comprising:
a fragmenting and multiplying unit configured to fragment the delay phase by N times (N is a natural number) to generate first to (N−1)th fragmented delay phases;
an adding unit configured to add each of the first to (N−1)th fragmented delay phases to the phase error to generate first to (N−1)th phase errors; and
a comparison unit configured to acquire a phase error compensation value nearest to an actual phase error from the phase error and the first to (N−1)th phase errors.

2. The apparatus of claim 1, wherein when the TDC within the phase detector performs a descending arithmetic operation, the fragmenting and multiplying unit comprises first to (N−1)th multipliers configured to multiply each of first to ((N−1)/N)th values to the delay phase to generate the first to (N−1)th fragmented delay phases.

3. The apparatus of claim 1, wherein when the TDC within the phase detector performs an ascending arithmetic operation, the fragmenting and multiplying unit comprises first to (N−1)th multipliers configured to multiply each of first to ((N−1)/N)th values to the delay phase to generate the first to (N−1)th fragmented delay phases.

4. The apparatus of claim 3, wherein the adding unit comprises first to (N−1)th adders configured to add the first to (N−1)th fragmented delay phases to the phase error to generate the first to (N−1)th phase errors.

5. An apparatus for compensating for an error of a TDC, which receives a delay phase and a TDC error-contained phase error from a phase detector including the TDC, the apparatus comprising:
first to Mth multipliers configured to fragment the delay phase by ½ to $½^M$ times;
first to (2M−1)th adders configured to add the phase error to an output from the first multiplier, and to add and to subtract an output of an upper comparator to and from each of outputs from second to Mth multipliers; and
first to Mth comparators configured to compare the phase error and an output from the first adder and to compare the output from the upper comparator and outputs from mutually adjacent adders among the second to the (2M−1)th adders to acquire a phase error compensation value nearest to an actual phase error.

6. The apparatus of claim 5, wherein the first adder adds the output from the first multiplier and the phase error.

7. The apparatus of claim 5, wherein the mutually adjacent adders among the second to (2M−1)th adders add and subtract an output of the same multiplier to and from an output from the same comparator, and among the adjacent adders, adders located at the even numbered columns add the outputs from the comparators to the outputs from the multipliers, and adders located at the odd numbered columns subtract the outputs from the comparators from the outputs from the multipliers.

8. The apparatus of claim 5, wherein the first comparator compares the phase error with the output from the first adder to acquire a phase error nearest to an actual phase error, and outputs the acquired phase error.

9. The apparatus of claim 5, wherein each of the second to Mth comparators compares the output from the upper comparator with the outputs from the adjacent adders to acquire a phase error nearest to the actual phase error, and outputs the acquired phase error.

10. An apparatus for compensating for an error of a TDC, which receives a delay phase and a TDC error-contained phase error from a phase detector including the TDC, the apparatus comprising:
a primary comparison unit configured to add a delay phase, which has been fragmented by ½ times, to the phase error, and to compare the resultant value with the phase error;
a multiplexer configured to receive an output from the primary comparison unit and a phase error correction value, to selectively output an output from the primary comparison unit when a control signal has a first value, and to selectively output the phase error correction value when the control signal has a second value; and a secondary comparison unit configured to add or to subtract a delay phase, which has been fragmented by ½M (M is a natural number of 2 or larger), to and from an output from the multiplexer, and to compare the resultant value with the output from the multiplexer to acquire a phase error compensation value nearest to an actual phase error.

11. The apparatus of claim 10, further comprising:
a counter configured to count the M and to provide the counted M to the comparison unit.

12. The apparatus of claim 10, wherein the primary comparison unit comprises:
a multiplier configured to multiply ½ to the delay phase to generate a delay phase which has been fragmented by ½ times;

an adder configured to add the phase error to an output from the multiplier to generate the first phase error; and a comparator configured to compare the first phase error and the phase error to output a comparison result value.

13. The apparatus of claim 10, wherein the secondary comparison unit comprises:
a multiplier configured to multiply $\frac{1}{2}^M$ to the delay phase to generate a delay phase fragmented by $\frac{1}{2}^M$ times;

a first adder configured to add the delay phase, which has been fragmented by $\frac{1}{2}^M$ times, to an output from the multiplexer; and a second adder configured to subtract the delay phase, which has been fragmented by $\frac{1}{2}^M$ times, from the output from the multiplexer.

* * * * *